(12) United States Patent
Hirler et al.

(10) Patent No.: US 9,548,400 B2
(45) Date of Patent: Jan. 17, 2017

(54) METHOD OF CONTROLLING BREAKDOWN VOLTAGE OF A DIODE HAVING A SEMICONDUCTOR BODY

(71) Applicant: Infineon Technologies Austria AG, Villach (AT)

(72) Inventors: Franz Hirler, Isen (DE); Joachim Weyers, Hoehenkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/868,991

(22) Filed: Sep. 29, 2015

(65) Prior Publication Data

US 2016/0093747 A1 Mar. 31, 2016

Related U.S. Application Data

(62) Division of application No. 13/250,265, filed on Sep. 30, 2011, now Pat. No. 9,184,255.

(51) Int. Cl.

| H01L 29/866 | (2006.01) |
| H01L 29/40 | (2006.01) |
| H01L 29/66 | (2006.01) |
| H01L 29/36 | (2006.01) |

(52) U.S. Cl.
CPC ............ *H01L 29/866* (2013.01); *H01L 29/40* (2013.01); *H01L 29/407* (2013.01); *H01L 29/66106* (2013.01); *H01L 29/66113* (2013.01); *H01L 29/36* (2013.01)

(58) Field of Classification Search
CPC ................................................ H01L 29/66106
See application file for complete search history.

(56) References Cited

U.S. PATENT DOCUMENTS

| 4,941,026 A | 7/1990 | Temple |
| 5,381,026 A * | 1/1995 | Shinohe ............ H01L 29/42308 257/147 |
| 5,578,508 A | 11/1996 | Baba et al. |
| 7,056,761 B1 | 6/2006 | Vashchenko et al. |

(Continued)

FOREIGN PATENT DOCUMENTS

| CN | 101180737 A | 5/2008 |
| CN | 101536189 A | 9/2009 |

(Continued)

*Primary Examiner* — Eugene Lee
(74) *Attorney, Agent, or Firm* — Murphy, Bilak & Homiller, PLLC

(57) ABSTRACT

A diode includes a semiconductor body, a first emitter region of a first conductivity type, a second emitter region of a second conductivity type, a base region arranged between the first and second emitter regions and having a lower doping concentration than the first and second emitter regions, a first emitter electrode electrically coupled to the first emitter region, a second emitter electrode in electrical contact with the second emitter region, a control electrode arrangement comprising a first control electrode section and a first dielectric layer arranged between the first control electrode section and the semiconductor body, and at least one pn junction extending to the first dielectric layer, or arranged distant to the first dielectric layer by less than 250 nm. The breakdown voltage of the diode is adjusted by applying a control potential to the first control electrode section.

20 Claims, 7 Drawing Sheets

(56) References Cited

U.S. PATENT DOCUMENTS

| | | | |
|---|---|---|---|
| 7,372,103 | B2 | 5/2008 | Zundel et al. |
| 7,456,487 | B2 | 11/2008 | Ogura et al. |
| 7,492,034 | B2 | 2/2009 | Pfirsch |
| 7,582,939 | B2 | 9/2009 | Bakran et al. |
| 7,728,382 | B2 | 6/2010 | Tsuzuki et al. |
| 8,129,780 | B2 | 3/2012 | Shinbori et al. |
| 8,168,999 | B2 | 5/2012 | Tsuzuki et al. |
| 8,405,122 | B2 | 3/2013 | Kouno et al. |
| 8,674,727 | B2 | 3/2014 | Mauder et al. |
| 2002/0121678 | A1 | 9/2002 | Huang |
| 2002/0179950 | A1 | 12/2002 | Hijzen et al. |
| 2007/0096172 | A1 | 5/2007 | Tihanyi et al. |
| 2007/0120181 | A1 | 5/2007 | Ruething et al. |
| 2009/0039419 | A1 | 2/2009 | Zundel et al. |
| 2010/0078765 | A1 | 4/2010 | Schulze et al. |
| 2010/0200910 | A1 | 8/2010 | Yedinak et al. |
| 2013/0001695 | A1 | 1/2013 | Guan et al. |
| 2013/0075784 | A1 | 3/2013 | Ikeda |

FOREIGN PATENT DOCUMENTS

| | | |
|---|---|---|
| DE | 10308313 A1 | 9/2004 |
| DE | 102004042758 A1 | 3/2006 |
| DE | 102006036347 A1 | 4/2008 |
| JP | 2000299476 A | 10/2000 |
| WO | 2011001588 A1 | 1/2011 |
| WO | 2011111500 A1 | 9/2011 |

* cited by examiner

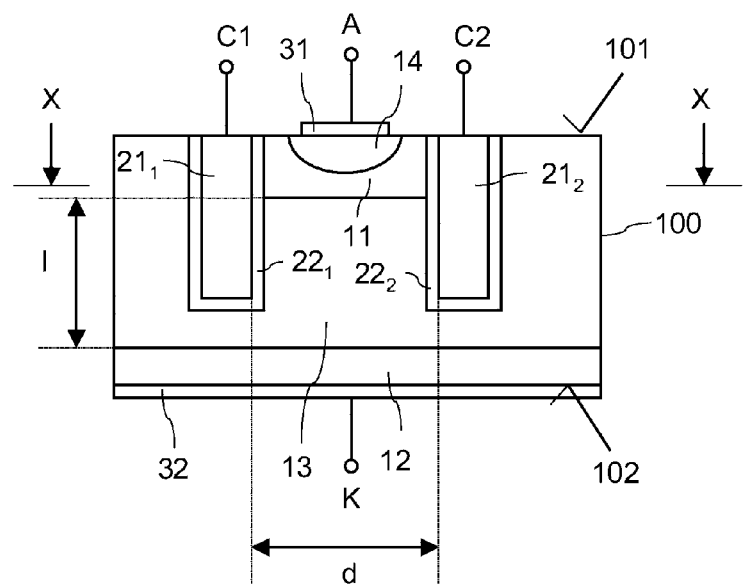
FIG 1
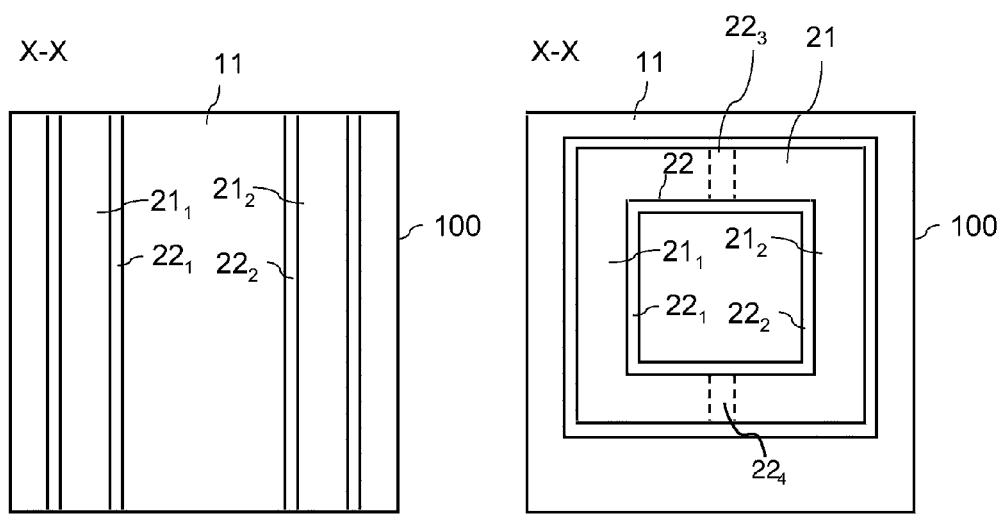
FIG 2
FIG 3

METHOD OF CONTROLLING BREAKDOWN VOLTAGE OF A DIODE HAVING A SEMICONDUCTOR BODY

TECHNICAL FIELD

Embodiments of the present invention relate to a diode, in particular a diode with a controllable breakdown voltage.

BACKGROUND

Diodes are rectifying elements which conduct a current when they are forward biased and which block when they are reverse biased. When, however, the reverse voltage is higher than a breakdown voltage of the diode, a current can also flow in the reverse direction. Some types of diodes, like Zener diodes or avalanche diodes have a well defined breakdown voltage, which makes these diodes suitable to be used as voltage limiting elements or as reference voltage generating elements.

The breakdown voltage in conventional diodes is mainly given by the doping concentrations of the individual semiconductor regions that form the diode and by the diode layout. Thus, the breakdown voltage in conventional diodes is fixed. However, especially in applications in which a diode is used as a voltage limiting element or as a reference voltage generating element, it may be desirable to vary the breakdown voltage within a given range.

SUMMARY

A first embodiment relates to a diode, including: a semiconductor body; a first emitter region of a first conductivity type; a second emitter region of a second conductivity type; a base region arranged between the first and second emitter regions and having a lower doping concentration than the first and second emitter region; a first emitter electrode only electrically coupled to the first emitter region; a second emitter electrode in electrical contact with the second emitter region; a control electrode arrangement including a first control electrode section, and a first dielectric layer, the first dielectric layer being arranged between the first control electrode section and the semiconductor body; and at least one pn junction extending to the first dielectric layer or arranged distant to the first dielectric layer by less than 250 nm.

A second embodiment relates to a method of controlling the breakdown voltage of a diode including a control electrode arrangement including a first control electrode section, and a first dielectric layer arranged between the first control electrode section and a semiconductor body, and at least one pn junction extending to the first dielectric layer or arranged distant to the first dielectric layer by less than 250 nm. The method comprises adjusting the breakdown voltage by applying a control potential to the first control electrode section.

Those skilled in the art will recognize additional features and advantages upon reading the following detailed description, and upon viewing the accompanying drawings.

BRIEF DESCRIPTION OF THE DRAWINGS

Embodiments of the invention will now be explained with reference to the drawings. The drawings serve to illustrate the basic principle, so that only features necessary for understanding the basic principle are illustrated. The drawings are not to scale. Like reference numbers denote like features throughout the drawings. In the drawings:

FIG. 1 schematically illustrates a vertical cross section through a semiconductor body in which a diode with a control arrangement and an adjustable breakdown voltage is integrated;

FIG. 2 illustrates a first embodiment of the control arrangement of the diode of FIG. 1;

FIG. 3 illustrates a second embodiment of a control arrangement of the diode of FIG. 1;

DETAILED DESCRIPTION

Figure 4:
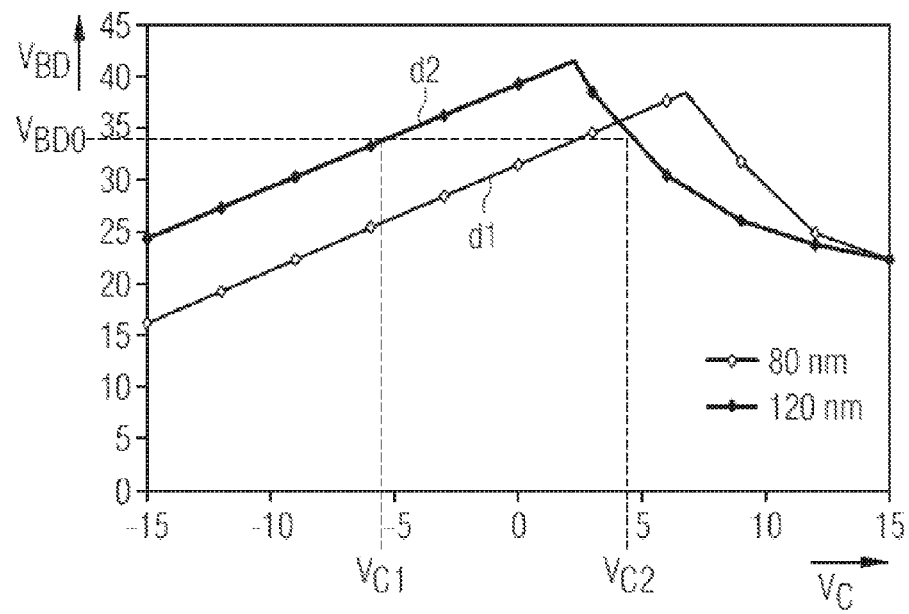
FIG. 4 schematically illustrates the breakdown voltage of a diode with a control arrangement dependent on a control voltage applied to the control arrangement.

FIG. 1 illustrates a first embodiment of a diode with adjustable breakdown voltage. The diode illustrated in FIG. 1 is a vertical diode which includes a first emitter region 11 of a first conductivity type, and a second emitter region 12 of a second conductivity type which is complementary to the first conductivity type. The first and second emitter regions 11, 12 are implemented in a semiconductor body 100 which includes a first surface 101 and a second surface 102 opposite to the first surface 101. In this embodiment, the first emitter region 11 is arranged near the first surface 101, and the second emitter region 12 is arranged near the second surface 102. The first and second emitter regions 11, 12 are arranged distant from one another in a vertical direction of the semiconductor body 100, wherein the vertical direction of the semiconductor body 100 is a direction which extends perpendicular to the first and second surfaces 101, 102. The semiconductor body 100 is, for example, made of silicon or any other suitable semiconductor material.

The diode further includes a base region 13 arranged between the first emitter region 11 and the second emitter region 12. The base region 13 is more lowly doped than the first and second emitter regions 11, 12 and is either of the first conductivity type or of the second conductivity type. For explanation purposes it is assumed that the first emitter region 11 is p-doped so as to form a p-emitter of the diode, that the second emitter region 12 is n-doped so as to form an n-emitter of the diode, and that the base region 13 is n-doped. The doping concentration of the p-emitter 11 is, for example, in the range of between 1e16 cm$^{-3}$ ($1 \cdot 10^{16}$ cm$^{-3}$) and 1e20 cm$^{-3}$ ($1 \cdot 10^{20}$ cm$^{-3}$). The doping concentration of the p-emitter may be rather constant throughout the p-emitter or may vary. According to one embodiment, the doping concentration of the p-emitter varies according to a Gaussian curve in a vertical direction, which is a direction perpendicular to the first surface 101. The doping concentration of the n-emitter is, for example, in the range of between 1e16 cm$^{-3}$ and 1e20 cm$^{-3}$, and the doping concentration of the base region 13 is, for example, in the range of between 5e13 cm$^{-3}$ and 1e13 cm$^{-}$. In a diode with an n-type base region 13 a pn-junction is formed between the p-emitter 11 and the base region 13.

Referring to FIG. 1, the diode further includes a first electrode 31 which electrically contacts the first emitter region 11, and a second electrode 32 which electrically contacts the second emitter region 12. In the embodiment illustrated in FIG. 1, the first electrode 31 is arranged on the first surface 101 and the second electrode 32 is arranged on the second surface 102 of the semiconductor body. When the first emitter region 11 is a p-emitter, the first electrode 31 forms an anode terminal A of the diode, while the second electrode 32 forms a cathode terminal K of the diode. This diode is conducting when a positive voltage higher than a forward voltage of the diode is applied between the anode A and the cathode K terminals. In a diode implemented in a silicon semiconductor body the forward voltage is about 0.7V. The diode is blocking when a positive voltage is applied between the cathode K and the anode A terminal (or when a negative voltage is applied between the anode A and the cathode K terminals). A positive voltage between the cathode K and the anode A terminals will be referred to as reverse voltage in the following. When, however, the reverse voltage reaches a breakdown voltage threshold—which is significantly higher than the forward voltage of the diode—the diode conducts a current in its reverse direction. This is a commonly known mechanism. In the diode of FIG. 1, however, the breakdown voltage threshold can be adjusted during operation of the diode. For this purpose the diode includes a control arrangement with a first control electrode section $21_1$ and a second control electrode section $21_2$ which are dielectrically insulated from the semiconductor body 100 by a first dielectric layer $22_1$ and a second dielectric layer $22_2$, respectively. In the diode illustrated in FIG. 1, the first and second control electrode sections $21_1$, $21_2$ are arranged in trenches which extend into the semiconductor body 100. In the embodiment illustrated in FIG. 1, these trenches extend into the semiconductor body 100 from the first surface 101.

The control electrode sections $21_1$, $21_2$ are arranged distant from one another in a horizontal direction (which extends perpendicular to the vertical direction) of the semiconductor body 100. The first emitter region 11 is arranged between the two control electrode sections $21_1$, $21_2$ in this horizontal direction, and a pn-junction between the first emitter region 11 and the base region 13 in this horizontal direction extends to the first and second dielectric layers 22, which insulate the first and second control electrode sections $21_1$, $21_2$ from the semiconductor body 100.

In the diode of FIG. 1, the base region 13 extends in a vertical direction of the semiconductor body 100 from the first emitter region 11 to the second emitter region 12. A length l of the base region 13 is defined by a (shortest) distance between the first emitter region 11 and the second emitter region 12. The base region 13 is at least partially arranged between the first and second control electrode sections $21_1$, $21_2$ and the first and second dielectric layers $22_1$, $22_2$, respectively. Adjacent to the base region 13 the first and second control electrode sections $21_1$, $21_2$ extend along at least 25%, 50%, 75% or even 100% of the length l of the base region 13. In other words: A distance in the vertical direction of the semiconductor body 100 between the second emitter region 12 and the first and second control electrode sections $21_1$, $21_2$ is less than 75%, 50%, 25% or even 0% of the length l of the base region 13. In the last mentioned case, the control electrode sections $21_1$, $21_1$ surrounded by the first and second dielectric layers $22_1$, $22_2$ extend to or into the second emitter region 12.

The control electrode sections $21_1$, $21_2$ include an electrically conducting material, such as a metal or a highly doped polycrystalline semiconductor material. Suitable metals are, for example, copper (Cu), titanium (Ti), aluminum (Al), or tungsten (W). A suitable polycrystalline semiconductor material is, for example, polysilicon. The dielectric layers $22_1$, $22_2$ may include a conventional dielectric material, like an oxide or a nitride. According to one embodiment, the dielectric layers are implemented as composite layers which include at least two different dielectric layers.

The first and second control electrode sections $21_1$, $21_2$ serve to adjust a breakdown voltage of the diode. For this purpose, each of these control electrode sections $21_1$, $21_2$ includes a control terminal C1 and C2, respectively. According to one embodiment, these two control terminals C1, C2 have different control voltages or control potentials connected thereto. According to another embodiment these control terminals C1, C2 are connected to a terminal for a common control potential.

A semiconductor region between the trenches with the control electrode sections $21_1$, $21_2$ will be referred to as mesa region in the following. A width of this mesa region, which is a distance between the control electrode sections $21_1$, $21_2$ is d, wherein d is, e.g., between about 0.3 μm and 10 μm.

FIGS. 2 and 3 show horizontal cross sections through the diode of FIG. 1 in a horizontal section plane X-X to illustrate two different implementation examples of the control electrode sections $21_1$, $21_2$. In the embodiment illustrated in FIG. 2, the first and second control electrode sections $21_1$, $21_2$ are longitudinal electrodes which extend parallel to each other in a horizontal direction of the semiconductor body. In the embodiment illustrated in FIG. 3, the first and second control electrode sections $21_1$, $21_2$ are part of one control electrode 21 which—as seen in the horizontal plane X-X—has a rectangular geometry. The first and second control electrode sections $21_1$, $21_2$ are formed by those sections of the rectangular electrode 21 which are arranged opposite to each other. Optionally, these sections are dielectrically insulated from one another by dielectric layers $22_3$, $22_4$ (illustrated in dashed lines). Providing these dielectric layers $22_3$, $22_4$ makes it possible to apply different control potentials to the individual control electrode sections $21_1$, $21_2$. Having a control electrode with a rectangular geometry is only an example. Any other closed-loop geometry, like a circular geometry, may be used as well.

FIG. 4 schematically illustrates the operating principle of the diode illustrated in FIG. 1. FIG. 4 shows the breakdown voltage threshold or breakdown voltage $V_{BD}$ dependent on a control potential or control voltage $V_C$ applied to the control terminals C1, C2. FIG. 4 shows two curves which illustrate the breakdown voltage $V_{BD}$ versus the control voltage $V_C$ for two different diodes which have different thicknesses (dielectric thicknesses) of the dielectric layers $22_1$ and $22_2$ (see FIG. 1).

The curves illustrated in FIG. 4 were obtained by simulating a device with a trench depth of about 2.2 μm, a mesa width of about 0.9 μm and a doping concentration of the base region 13 between about 5e16 cm$^{-3}$ and 1e17 cm$^{-3}$. The first curve labeled with d1 represents a dielectric thickness of 80 nm while the curve labeled with d2 represents a larger thickness of 120 nm.

The control voltage $V_C$ is a voltage between the control terminals C1, C2 and the anode terminal A of the diode. In the diode for which the simulation results illustrated in FIG. 4 were obtained, the same control voltage $V_C$ was applied to both control terminals C1, C2. In FIG. 4 a control voltage range of −15V to +15V is illustrated. However, this is only an example; dependent on the specific embodiment of the diode other control voltage ranges may be applied as well. Generally, the breakdown voltage $V_{BD}$ increase with increasing control voltage $V_C$ until a maximum breakdown voltage $V_{BDmax}$ is reached, and starting from this maximum breakdown voltage $V_{BDmax}$ the breakdown voltage $V_{BD}$ decreases with further increasing control voltage $V_C$.

Referring to FIG. 4, the characteristic curves which illustrate the breakdown voltage $V_{BD}$ dependent on the control voltage $V_C$ have two sections: a first section in which the breakdown voltage $V_{BD}$ increases with increasing control voltage $V_C$; and a second section in which the breakdown voltage $V_{BD}$ decreases with increasing control voltage $V_C$. A certain breakdown voltage $V_{BD}$, like breakdown voltage $V_{BD0}$ illustrated in FIG. 4, can be obtained with two different control voltages, a first voltage $V_{C1}$ in the first section and a second voltage $V_{C2}$ in the second section. In other words: The breakdown voltage is $V_{BD0}$ when the control voltage $V_C$ is either $V_{C1}$ or $V_{C2}$. The maximum breakdown voltage $V_{BDmax}$ is obtained when the control voltage $V_C$ is $V_{Cmax}$ in the embodiment illustrated in FIG. 4. Control voltages $V_C$ smaller than $V_{Cmax}$ define the first section of the characteristic curves, and control voltages $V_C$ higher than $V_{Cmax}$ define the second section of the characteristic curves.

When the reverse voltage applied to the diode reaches the breakdown voltage $V_{BD}$, which is adjusted by suitably selecting the control voltage $V_C$, a breakdown, specifically an avalanche breakdown, occurs. In the component illustrated in FIG. 1, two different types of breakdown may occur: a first type in which the breakdown first occurs in the region of the bottoms of the trenches in which the first and second control electrode sections $21_1$, $21_2$ are arranged; and a second type of breakdown in which the breakdown first occurs in the region between the trenches with the first and second control electrode sections $21_1$, $21_2$. The first type of breakdown occurs when the control voltage $V_C$ is selected such that it is smaller than $V_{Cmax}$, i.e. when the corresponding breakdown voltage is in the first section of the characteristic curve, and the second type of breakdown occurs when the control voltage $V_C$ is higher than $V_{Cmax}$, i.e. when the corresponding breakdown voltage is in the second (falling) section of the characteristic curve. According to one embodiment, the control voltage for adjusting the breakdown voltage is selected from the second control voltage range. Using this voltage range a degradation of the breakdown characteristics can be avoided because avalanche multiplication occurs distant from semiconductor dielectric interfaces between the dielectric layers $22_1$, $22_2$ and the base region 13.

In the embodiment illustrated in FIG. 4, the breakdown voltage can be varied between about 40V and about 15V by suitably selecting the control voltage $V_C$ from the second control voltage range. It goes without saying that these are only exemplary voltages. Dependent on the doping concentrations of the individual semiconductor regions of the diode and dependent on design parameters, like the length of the base region 13, the dielectric thickness or the distance between the control electrode sections $21_1$, $21_2$—which defines a width of the base region 13—other breakdown voltage values can be obtained as well.

Referring to FIG. 1, the diode optionally includes a higher doped region 14 of the first conductivity type within the first emitter region 11. This higher doped region 14 is connected to the first electrode 31, and its geometry is such that it extends further to the pn-junction between the first emitter 11 and the base region 13 in the middle of the mesa region. The higher doped region 14 serves to provide a low-ohmic contact between the first electrode 31 and the first emitter region 11. Further, the higher doped region 14 can define the position at which the avalanche breakdown occurs first when the breakdown voltage is reached. In the embodiment illustrated in FIG. 1, this position is in the middle of the mesa region between the two trenches.

The control voltage $V_C$ is a voltage between the control terminals C1, C2 and the anode terminal A of the component. According to one embodiment, the same control voltage $V_C$ is applied between each of the control terminals C1, C2 and the anode terminal A. According to a further embodiment, one of the control terminals is electrically connected with the anode terminal, while the control voltage $V_C$ is only applied between the other one of the control terminals and the anode terminal A. A positive control voltage $V_C$ is a positive voltage between the control terminal and the anode terminal A, and a negative control voltage $V_C$ is a negative voltage between the control terminal and the anode terminal A.

The basic structure of the diode illustrated in FIG. 1 is similar to the parasitic body diode in a trench MOSFET. However, the diode, unlike a MOSFET, does not include a source region, so that in the diode there are not two semiconductor regions of the same doping type—like the source region and the drift region in a MOSFET—between which a conducting channel may occur induced by a gate electrode. Thus, the first electrode 31 of the diode is only connected to the first emitter region 11 and to the optional higher doped region 14 of the same doping type as the first emitter region 11, but is not also connected to a complementarily doped semiconductor region (like the source region in a MOSFET). In the diode according to FIG. 1, the control voltage applied between the control terminals C1, C2 and the anode terminal A only serves to adjust the breakdown voltage of the diode whereas in the presence of a source region a conductive channel would be opened when applying a control voltage to the control electrodes $21_1$, $21_2$.

A diode as illustrated in FIG. 1 can be used as a voltage limiting element which serves to limit the voltage across another electronic device (not shown in FIG. 1). The diode can be connected in parallel with the other electronic device and limits the voltage drop across the parallel circuit, and therefore across the other electronic device, to a voltage defined by the breakdown voltage of the diode. The diode could also be used to generate a reference voltage. For this, a reverse current is applied to the diode. The voltage drop (in the reverse direction) of the diode then equals the breakdown voltage of the diode and may be used as a reference voltage. This reference voltage can be adjusted by applying a suitably selected control voltage $V_C$ between the control terminals C1, C2 and the anode terminal A.

The basic principle of the diode illustrated in FIG. 1 has been explained based on a diode with a p-doped first emitter region 11 and an n-doped second emitter region 12. In this case, the first electrode 31 forms an anode terminal A, and the second electrode 32 forms a cathode terminal K. The basic principle of adjusting the breakdown voltage is, however, not restricted to be used in this specific type of diode. In a further embodiment, the first emitter region 11 is n-doped so that the first electrode 31 forms a cathode terminal, while the second emitter region 12 is p-doped, so that the second electrode 32 forms an anode terminal.

Figure 5:
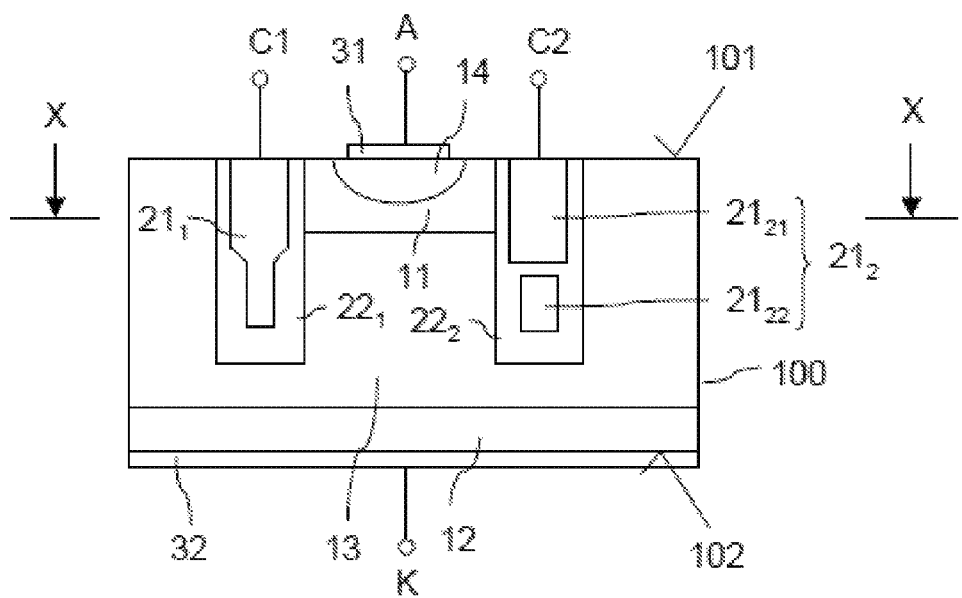
FIG. 5 illustrates a further embodiment of a vertical diode with a control arrangement.

FIG. 5 illustrates a further embodiment of a diode with adjustable breakdown voltage. The embodiment illustrated in FIG. 5 is different from the embodiment illustrated in FIG. 1 in that the dielectric layers $22_1$, $22_2$ have thicknesses which increase in the direction of the bottom of the trenches. In the embodiment illustrated in FIG. 5, these dielectric layers $22_1$, $22_2$ basically have two different thicknesses: a first thickness in a region adjacent to the first emitter region 11 and a second (higher) thickness adjacent to the base region 13. This, however, is only an example. It is also possible to have more than two different thicknesses of the dielectric layers $22_1$, $22_2$. It is also possible to have the thicknesses of the two dielectric layers $22_1$, $22_2$ increase gradually so as to have a lowest thickness at the top of the trenches, i.e. in the region of the first surface 101, and the highest thickness at the bottom of the trenches.

Referring to FIG. 5, it is also possible for the control electrodes to have two or more different electrode sections arranged one above the other in the trench. This is illustrated for the second control electrode section $21_2$ in FIG. 1. In this connection it should be mentioned that only one of the control electrode sections or both of the control electrode sections can be implemented with several separated electrode sections arranged in one trench. In the embodiment illustrated in FIG. 5, the second control electrode section $21_2$ includes two electrodes: a first electrode $21_{21}$ in the upper region of the trench; and a second electrode $21_{22}$ in the lower section of the trench. According to one embodiment, the control voltage is applied to both of these electrodes $21_{21}$, $21_{22}$. According to a further embodiment, the control voltage (like the control voltage $V_C$ illustrated in FIG. 4) is applied only to the second electrode $21_{22}$ in the lower trench section and arranged adjacent to the base region 13, while the first electrode $21_{21}$ in the upper trench region and adjacent to the first emitter 11 is connected to the first electrode 31 or the anode terminal A, respectively.

Further, it is also possible to provide at least two separate electrodes of the control electrode sections without varying the thickness of the dielectric layers $22_1$, $22_2$.

The diodes illustrated in FIGS. 1 and 5 are vertical diodes, because in these diodes a forward current or a breakdown current—dependent on whether the diode is forward biased or reverse biased—essentially flows in a vertical direction of the semiconductor body 100 between the first and second emitter regions 11, 12. In the diodes illustrated in FIGS. 1 and 5 the first and second electrodes 31, 32 are arranged on the opposite first and second surfaces 101, 102 of the semiconductor body 100.

Figure 6:
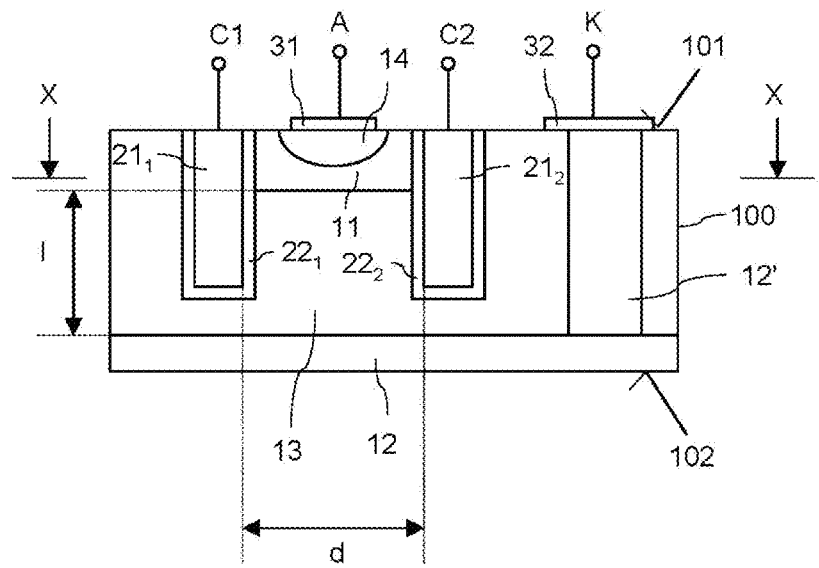
FIG. 6 illustrates an embodiment of a vertical diode that is a modification of the diode of FIG. 1.

FIG. 6 illustrates a further embodiment of a vertical diode. In this diode the second emitter 12 is implemented as a buried layer which in the vertical direction of the semiconductor body 100 is arranged distant to the first emitter region 11. This buried second emitter 12 is also arranged distant to the second surface 102 of the semiconductor body. Between the second emitter 12 and the second surface 102 a semiconductor region can be arranged which is doped complementarily to the second emitter 12. In the diode of FIG. 6, the second electrode 32 is arranged on the first surface 101 distant to the first electrode 31. The second emitter 12 is electrically connected to the second electrode 32 via a connection region 12'—which is also referred to as sinker— of the same conductivity type as the second emitter 12. In this embodiment, the connection region 12' is arranged outside the mesa region.

According to a further embodiment (not shown), the connection region 12' is arranged in the mesa region at a position that is distant to the first emitter region in a direction that is perpendicular to the section plane shown in FIG. 6.

Figure 7:
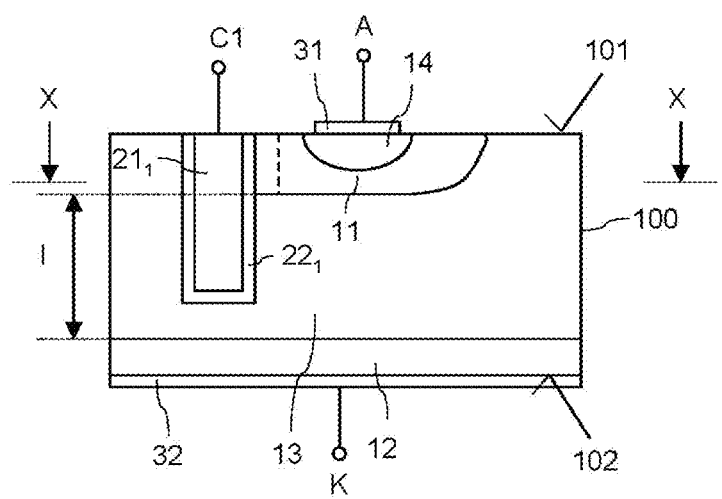
FIG. 7 illustrates a further embodiment of a vertical diode with adjustable breakdown voltage.

FIG. 7 illustrates a further embodiment of a vertical diode with adjustable breakdown voltage. The diode according to FIG. 7 is a modification of the diode of FIG. 1 and is obtained from the diode of FIG. 1 by omitting one of the control electrode sections, such as the second control electrode section $21_2$. The operating principle of the diode of FIG. 7 corresponds to the operating principle of the diode of FIG. 1 with the difference that the breakdown voltage is adjusted using only one control electrode section. The embodiments illustrated in FIGS. 5 and 6 as well as the embodiments explained below can be modified in the same way by omitting one of the control electrode sections, such as the second control electrode section $21_2$.

According to one embodiment illustrated in dashed lines in FIG. 7, the first emitter region 11 does not extend to the first dielectric layer $22_1$ in a horizontal direction but is arranged distant to the first dielectric layer $22_1$, $22_2$. The distance is, for example, between 50 nm and 250 nm, or less. In this case, the pn junction between the emitter region 11 and the base region is also distant to the first dielectric layer $22_1$, the distance being less than 200 nm.

Figure 8A:
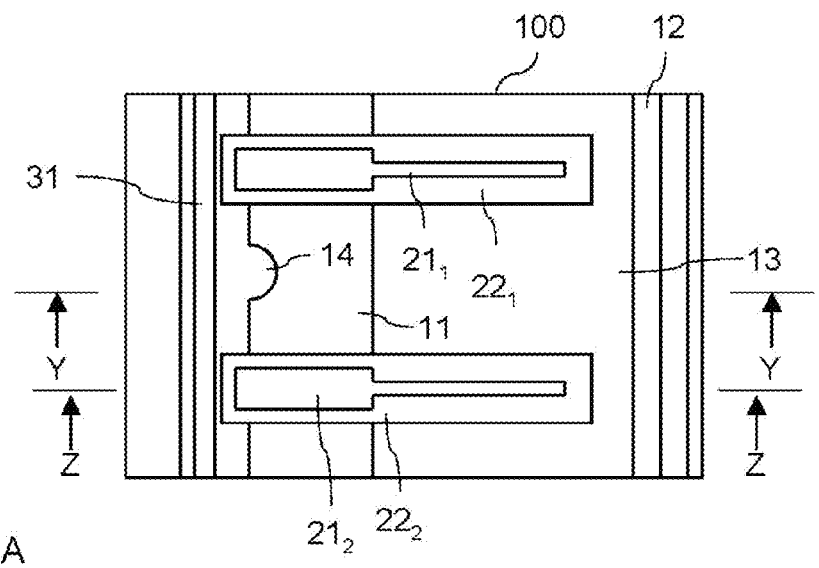
FIGS. 8A to 8C illustrate respective horizontal and vertical cross sections through a semiconductor body in which a lateral diode according to one embodiment is integrated.
Figure 8B:
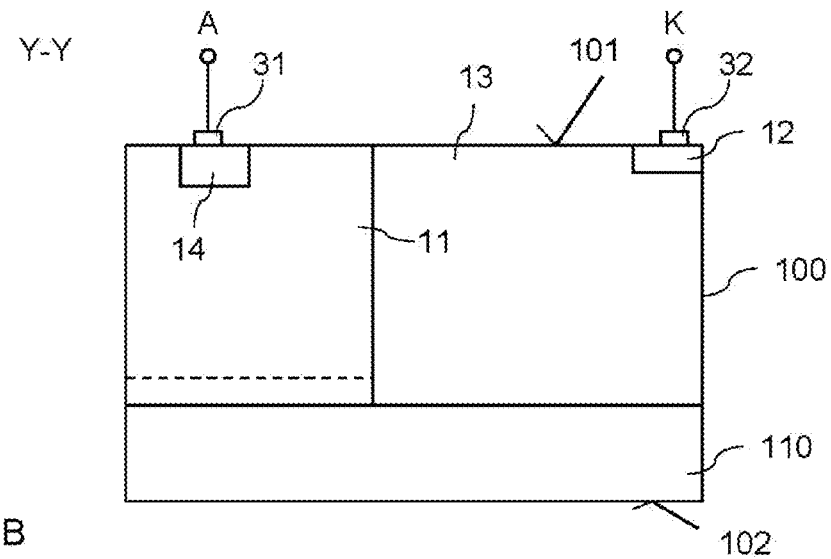
Figure 8C:
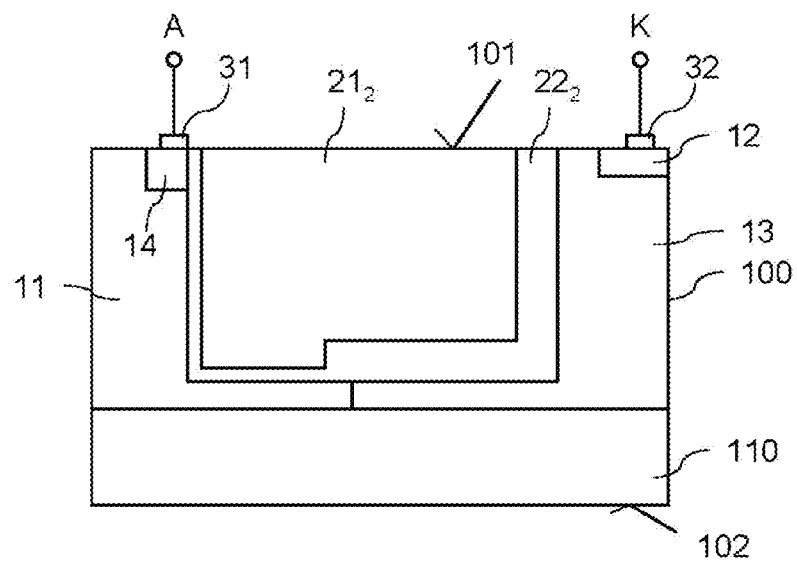

FIGS. 8A to 8C illustrate an embodiment of a lateral diode with adjustable breakdown voltage. FIG. 8A illustrates a top view on the first surface 101 of a semiconductor body 100 in which the diode is integrated, FIG. 8B illustrates a vertical cross section in a vertical section plane Y-Y, and FIG. 8C illustrates a vertical cross section in a vertical section plane Z-Z. In this diode, the first and second emitter regions 11, 12 are arranged distant from one another in a lateral or first horizontal direction of the semiconductor body 100. The first and second control electrode sections $21_1$, $21_2$ are arranged distant from one another in a second horizontal direction which is perpendicular to the first horizontal direction, and these control electrode sections $21_1$, $21_2$ extend in the first horizontal direction between the first emitter region 11 and the second emitter region 12. A length l of the base region 13 is defined by the dimension of the base region 13 in the first horizontal direction between the first and the second emitter regions. The first and second control electrode sections $21_1$, $21_2$ extend along the base region 13 in this first horizontal direction. Everything which has been explained concerning the relationship between the lengths l of the base region 13 and the extension of the first and second control electrode sections $21_1$, $21_2$ in the current flow direction of the component, and concerning the dopant concentrations and the design parameters applies to the lateral component of FIGS. 8A to 8C accordingly. A vertical cross section through the base region 13 is illustrated in FIG. 8B.

FIG. 8C illustrates a cross section through one of the control electrode sections, namely the second control electrode section $21_2$. The first control electrode section $21_1$ can be implemented equivalently. The control electrode sections $21_1$, $21_2$, referring to FIG. 8C, also extend in the vertical direction 100 of the semiconductor body, wherein the base region 13 and at least the first emitter region 11 also extend in the vertical direction of the semiconductor body 100. In the embodiment illustrated in FIGS. 8A to 8C the dielectric layers $22_1$, $22_2$ have different thicknesses. However, this is only an example. These dielectric layers could also be implemented to have a constant thickness. Further, a control electrode section could be implemented with several separate electrodes, which has been explained with reference to FIG. 5 herein before.

In the lateral diode of FIGS. 8A to 8C the first and second electrodes 31, 32 contacting the first and second emitter regions 11, 12, respectively, are arranged on the first side 101 of the semiconductor body 100. A second surface 102 of the semiconductor body is, for example, formed by a semiconductor substrate 110. The substrate can be doped complementarily to the base region 13 or can have the same doping type as the base region 13. Referring to FIG. 8C, the control electrode sections do not extend into the substrate 110. However, this is only an example. The trenches with the control electrode sections $21_1$, $21_2$ could also extend into the substrate.

While in the embodiment illustrated in FIG. 8B the first emitter region adjoins the substrate, the first emitter region could also be arranged distant to the substrate 110 as illustrated in dashed lines in FIG. 8B. In this case, a section of the base region 13 is arranged between the first emitter region 11 and the substrate 110.

Optionally the diode includes a higher doped semiconductor region 14 of the first conductivity type in the first emitter region 11. This semiconductor region 14 in the middle of the mesa region between the control electrode sections $21_1$, $21_2$ extends laterally further to the second emitter region 13 than in other regions, so that the position at which an avalanche breakdown occurs first is in the middle of the mesa region.

Figure 9:
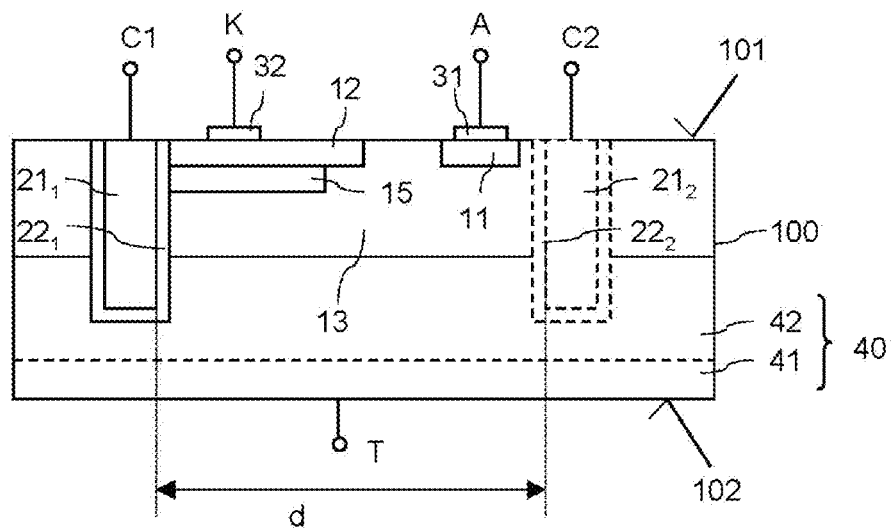
FIG. 9 illustrates a lateral Zener diode according to a first embodiment.

FIG. 9 illustrates a further embodiment of a diode with adjustable breakdown voltage. In this diode the first and second emitter regions 11, 12 are arranged distant from one another in a horizontal direction of the semiconductor body 100 and are arranged in the region of the first surface 101 of the semiconductor body. The first and second emitter regions 11, 12 are electrically contacted by the first and second electrodes 31, 32, respectively, which are arranged on the first surface 101. For explanation purposes it is assumed that the first emitter region 11 is p-doped and that the second emitter region 12 is n-doped, so that the first electrode 31 forms an anode terminal A and the second electrode 32 forms a cathode terminal K of the diode.

The first and second emitter regions 11, 12 are both arranged between the trenches with the first and second control electrode sections $21_1$, $21_2$. These trenches extend in a vertical direction of the semiconductor body 100 from the first surface 101. The first and second gate electrode sections $21_1$, $21_2$ are dielectrically insulated from the semiconductor body 100 by the first and second dielectric layers $22_1$, $22_2$. These dielectric layers $22_1$, $22_2$ can be implemented like the dielectric layers $22_1$, $22_2$ of FIGS. 1, 5 and 6.

The second trench as well as the second control electrode $21_2$ and the second dielectric layer $22_2$ mainly serve as a lateral insulation trench structure and can be omitted in other embodiments. Thus, this electrode $21_2$ and the surrounding dielectric layer $22_2$ are illustrated in dashed lines in FIG. 9.

The base region 13 is arranged between the first and second emitter regions 11, 12. In the embodiment illustrated in FIG. 9, the base region 13 in the horizontal direction extends from the trench with the first control electrode section $21_1$, and the first dielectric layer $22_1$ to the second trench with the second control electrode section $21_2$ and the second dielectric layer $22_2$. In the vertical direction the base region 13 extends further into the semiconductor body 100 than the first and second emitter regions 11, 12. In the embodiment illustrated in FIG. 9, the base region 13 is completely arranged between the trenches, i.e. the base region 13 in the vertical direction of the semiconductor body 100 does not extend below the trenches with the first and second gate electrode sections $21_1$, $21_2$.

In another embodiment (not illustrated) the base region 13 extends below the trenches with the first and second control electrode sections $21_1$, $21_2$ in the vertical direction of the semiconductor body 100.

The diode illustrated in FIG. 9 is implemented as a Zener diode. In this diode, the base region 13 is of the first conductivity type, i.e. of the same conductivity type as the first emitter region 11, while in embodiments of the diode according to FIGS. 1, 5, 6 and 7 the base region is doped complementary to the first emitter region. In the base region 13 a Zener region 15 is arranged that is higher doped than remaining sections of the base region 13. According to one embodiment, the Zener region is of the first conductivity type, which is the conductivity type of the first emitter region 11 and the base region 13. According to a further embodiment, the Zener region 15 is of the second conductivity type, which is the conductivity type of the second emitter region 12. Dependent on the conductivity type of the Zener region 15, the pn-junction is either formed between the Zener region 15 and the second emitter region 12 or between the Zener region 15 and the base region 13.

In the embodiment illustrated in FIG. 9, the Zener region 15 adjoins the second emitter region in the vertical direction of the semiconductor body 100. The Zener region 15 does not completely surround the second emitter region 12, so that there are regions in which the second emitter region 12 adjoins the base region 13. When the Zener region 15 has the second conductivity type and when the breakdown voltage of the diode is reached, an avalanche breakdown occurs at a position where the base region 13 adjoins the second emitter region 12.

The doping concentrations of the individual semiconductor regions are, for example, as follows: first emitter region 11: between 1e18 $cm^{-3}$ and 1e21 $cm^{-3}$; second emitter region 12: between 1e18 $cm^{-3}$ and 1e21 $cm^{-3}$; base region 13: between 1e14 $cm^{-3}$ and 1e18 $cm^{-3}$; Zener region 15: between 1e16 $cm^{-3}$ and 1e19 $cm^{-3}$.

Vertical dimensions of the semiconductor regions, which are dimensions in a direction perpendicular to first surface 101 are, for example, as follows: first emitter region 11: between 0.1 µm and 1 µm; second emitter region 12: between 0.1 µm and 1 µm; Zener region 15: between 0.2 µm and 2 µm.

Lateral dimensions of the individual semiconductor regions in the section plane illustrated in FIG. 9 are, for example, as follows: first emitter region 11: between 20 nm and several µm; second emitter region 12: between 20 nm and several µm; base region 13: between 500 nm and several µm, where this dimension may correspond to a mesa width between the control electrode sections $21_1$, $21_2$. The lateral dimension of the Zener region 15 is such that it is smaller than the lateral dimension of the second emitter region 12 it adjoins. Further, a vertical dimension (depth) of the base region 13 should be chosen such that a Zener (breakthrough) voltage between the second emitter region 12 and the Zener region 15 is smaller than an Avalanche breakthrough voltage between a semiconductor layer 40 on which the base region 13 is arranged, the base region 13, the Zener region 15 and the first emitter region 12.

In the diode of FIG. 9, the base region 13—in which the emitter regions 11, 12 are arranged—is arranged above a semiconductor layer 40. According to one embodiment, the semiconductor layer 40 includes two sublayers: a first layer 41 which forms the second surface 102 of the semiconductor body, and a second semiconductor layer 42 arranged between the first layer 41 and the base region 13 and being more lowly doped than the first layer. The first layer 41 is, for example, a substrate. The other semiconductor layers, i.e. the second layer 42 and the layer in which the base region 13 is implemented, can be epitaxial or implanted and diffused layers. According to one embodiment, a doping type of the second layer is complementary to a doping type of the base region 13. The first layer (substrate) may have the same doping type as the second layer or may have a complementary doping type.

While in the embodiment illustrated in FIG. 9, the trench with the first control electrode section $21_1$ and the trench with the optional second control electrode section $21_2$ extend through the base region 13, so that these trenches extend deeper into the semiconductor body 100 than the base region 13, it is also possible to implement the base region 13 such that it extends beyond the trench(es) as seen from the first surface 101.

According to one embodiment, the semiconductor layer 40 includes a terminal T to apply an electrical potential at this semiconductor layer 40. This electrical potential is, for example, selected such that the injection of minority charge carriers from the base region 13 into the semiconductor layer 40 is prevented when the diode is in operation. According to one embodiment, the electrical potential applied to this terminal T is, for example, in the range of between 0V and 1000V, in particular between 0V and 400V. By suitably selecting the doping concentration of the base region 13 and the semiconductor layer 42, a voltage blocking capability between the diode, which means between device regions of the diode, and the semiconductor layer 40 can be adjusted. Dependent on the doping concentration and thickness of the base region 13 and the second semiconductor layer 42, this voltage blocking capability may range between 0V and 1000V.

Figure 10:
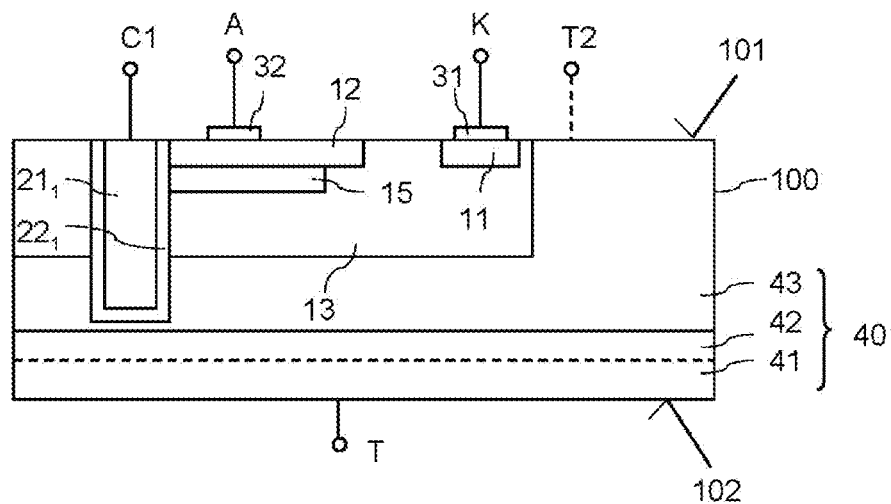
FIG. 10 illustrates a lateral Zener diode according to a second embodiment.

FIG. 10 illustrates a further embodiment of a Zener diode. The Zener diode illustrated in FIG. 10 is based on the Zener diode illustrated in FIG. 9, so that in the following only those feature of the Zener diode of FIG. 10 that are different from the Zener diode of FIG. 9 will be explained.

In the Zener diode of FIG. 10, the first conductivity type is an n-type, while the second conductivity type is a p-type. Thus, the first emitter region 11 is an n-emitter and the second emitter region is a p-emitter, so that the first electrode 31 forms a cathode terminal and the second electrode 32 forms an anode terminal of the Zener diode. The base region 13 and the Zener region 15 are both of the first conductivity type, so that a pn-junction is formed between the Zener region 15 and the second emitter region 12. An n-doping of the base region of the diode of FIG. 10 instead of a p-doping as in the diode of FIG. 9 helps to reduce the electrical resistance of the Zener diode when forward biased.

A pn-junction is formed between the base region 13 and the substrate 40. In this embodiment, the substrate 40 includes at least one third semiconductor layer or region 43 adjoining the base region 13 and doped complementarily to the base region. According to one embodiment, the third region 43 is electrically connected to a further biasing terminal T2. Referring to FIG. 10, the third region 43 may extend to the first surface 101 of the semiconductor body and may be electrically connected to the further terminal T2 at the first surface. A biasing potential applied to this further terminal T2 may be a reference potential, such as ground. The biasing potential is, for example, between 0V and 1000V, in particular between 0V and 700V.

Optionally, the substrate includes a further semiconductor layer 41, corresponding to the first layer 41 of FIG. 9. The doping type of the first layer 41 corresponds to the doping type of the base region 13 and is complementary to the doping type of the third layer 43. Optionally, a further layer 42 corresponding to the second layer 42 of FIG. 9 is arranged between the first layer 41 and the third layer. A doping type of the second layer corresponds to a doping type of the first layer 41, with the second layer 42 having a lower doping concentration. The first layer may be connected to the terminal T for applying a biasing potential.

Figure 11:
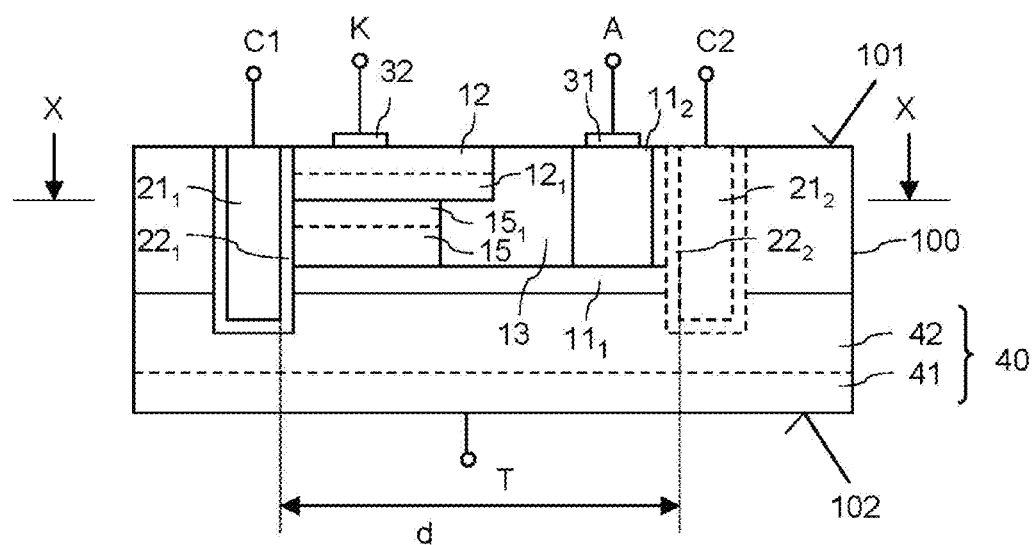
FIG. 11 illustrates a lateral Zener diode according to a third embodiment.

FIG. 11 illustrates a modification of the diode illustrated in FIG. 9. In the diode of FIG. 11, the first emitter 11 includes two emitter sections: a first emitter section $11_1$ which in the vertical direction of the semiconductor body 100 is arranged distant to the second emitter region 12 and which in a horizontal direction may adjoin the first dielectric layer $22_1$; and a second emitter section $11_2$ which is arranged distant to the second emitter 12 in the horizontal direction and which in the vertical direction extends from the first surface 101 to the first section $11_1$ so as to connect the first section $11_1$ of the first emitter to the first electrode 31. The Zener region 15 is arranged between the first section $11_1$ of the first emitter 11 and the second emitter 12. In this embodiment, the Zener region 15 adjoins the first section $11_1$ and the second emitter 12. According to one embodiment, the Zener region 15 and the second emitter 12 optionally are doped lower in those regions in which the second emitter 12 and the Zener region 15 adjoin one another. These lower doped regions are illustrated in dashed lines and are denoted as $15_1$ and $12_1$ in FIG. 11. The substrate layer 40, the first emitter section $11_1$, the base region 13, the Zener region 15, the second emitter region 12 and the first control electrode section $21_1$ form a parasitic MOSFET when the substrate layer 40 is doped complementary to the base region 13. A threshold voltage of this parasitic MOSFET can be adjusted through the doping concentration of the first emitter region section $11_1$, the base region 13 and the Zener region 15.

In the embodiment illustrated in FIG. 10, the semiconductor regions of the diode are completely arranged between the trenches with the control electrode sections $21_1$, $21_2$, i.e. also the first section $11_1$ of the first emitter does not extend to below these trenches in this embodiment.

Figure 12:
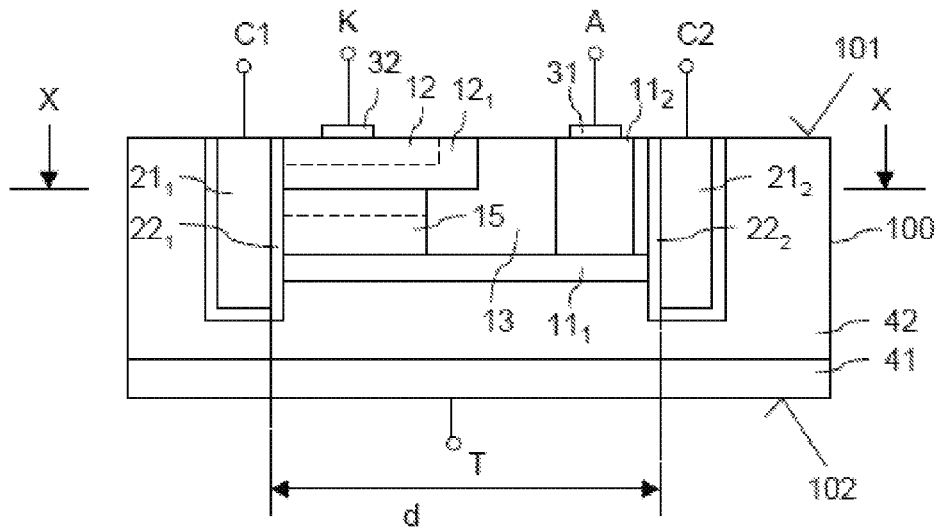
FIG. 12 illustrates a lateral Zener diode according to a fourth embodiment.

FIG. 12 illustrates a modification of the diode of FIG. 11. In this diode the lower doped region $12_1$ of the second emitter completely surrounds the higher doped region within the semiconductor body 100. Thus, unlike in the diode of FIG. 11, the higher doped region of the emitter does not adjoin the base region 13.

According to one embodiment, a ratio between the doping concentration of the higher doped region and the lower doped region $12_1$ of the second emitter 12 is between 1e2 (100) and 1e5 (10000), and a ratio between the doping concentration of the higher doped region and the lower doped region $15_1$ of the Zener region 15 is between 2 and 100. The lower doped region $12_1$ of the second emitter region 12, and the lower doped region $15_1$ of the Zener region 15 are, for example, produced in the base region by implantation and diffusion processes. The lower doped second emitter region $12_1$ can be produced by implanting dopant atoms of the second dopant type, such as arsenic (As) atoms in that region of the second emitter 12 for which a higher doping concentration is desired and by diffusing the implanted dopant atoms deeper into the base region 13 by employing an annealing process. The lower doped Zener region $15_1$ can be produced by implanting dopant atoms of the first dopant type, such as Boron (B) atoms in that region of the Zener region 15 for which a higher doping concentration is desired and by diffusing the implanted dopant atoms into the surrounding regions of the base region. For obtaining a diode as illustrated in FIGS. 11 and 12, the dopant atoms of the first dopant type, that form the Zener region 15, are implanted deeper into the semiconductor body 100 than the dopant atoms of the second dopant type, that form the second emitter region 12. The dopant atoms of the second dopant type mainly diffuse deeper into the semiconductor body, which is away from the first surface 101, so as to form the lower doped region $12_1$ below the higher doped region. The dopant atoms of the first dopant type diffuse into the first section $11_1$ of the first emitter 11, which is below the Zener region 15, and into the direction of the first surface, so as to form the lower doped Zener region $15_1$ above the higher doped Zener region.

In the embodiments illustrated in FIGS. 11 and 12, the Zener region 15 is arranged between the first emitter region 11, specifically the first section $11_1$ of the first emitter region 11, and the second emitter region 12. In these embodiments, the Zener region 15 has the function of a base region, wherein either between the Zener region 15 and the first emitter region 11 or between the Zener region 15 and the second emitter 12 a pn junction is formed and extends to the first dielectric layer $22_1$. However, the pn-junction could also be arranged distant to the first dielectric layer $22_1$ up to 250 nm.

Figure 13:
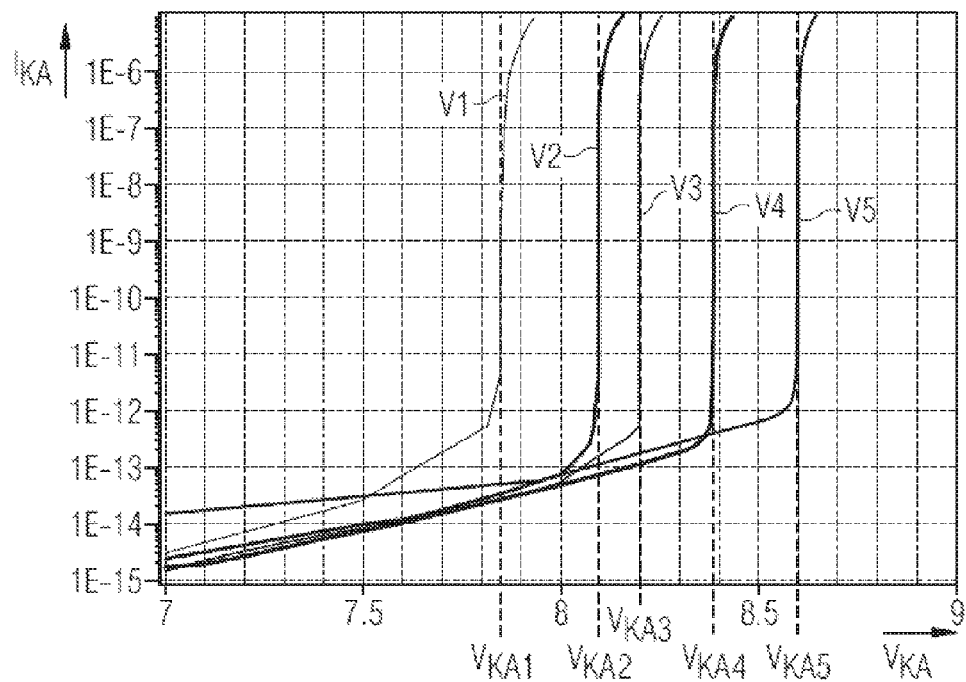
FIG. 13 illustrates characteristic curves of the Zener diodes according to FIGS. 9 to 12.

Like in the diodes illustrated in FIGS. 1, 5 and 6 a breakdown voltage of the diodes illustrated in FIGS. 9, 10, 11 and 12 can be adjusted by applying a control voltage between the control terminals C1, C2 and one of the anode and the cathode terminals A, K. According to one embodiment, the control voltage is applied between the control terminals C1, C2 and the anode terminal A. According to a further embodiment, the same control voltage is applied to the first and second control terminals C1, C2. An avalanche breakdown or Zener breakdown occurs when the diode is reverse biased and when the reverse biasing voltage reaches a breakdown voltage which is defined by the control voltage. The operating principle of this diode becomes obvious from FIG. 13, in which several characteristic curves are illustrated which show a reverse current $I_{KA}$ of the diode dependent on a reverse biasing voltage $V_{KA}$. These characteristic curves were obtained for five different control voltages $V_C$=V1, $V_C$=V2, $V_C$=V3, $V_C$=V4, and $V_C$=V5. As can be seen from FIG. 13, a significant increase in the reverse current $I_{KA}$ occurs when the reverse voltage $V_{KA}$ reaches threshold voltages $V_{KA1}$, $V_{KA2}$, $V_{KA3}$, $V_{KA4}$, and $V_{KA5}$. These threshold voltages correspond to the breakdown voltages of the diode. Referring to FIG. 13, these breakdown voltages are dependent on the control voltage. According to one embodiment, V1=−15V, V2=−10V, V3=−5V, V4=0V, and V5=+5V.

Although the operating principle of the diode illustrated in FIGS. 9 to 11 has been explained with reference to a diode in which the first emitter 11 is p-doped and the second emitter 12 is n-doped, it should be noted that this operating principle also applies to a diode in which the first emitter 11 is n-doped and the second emitter 12 is p-doped. In this case, the first electrode 31 forms a cathode and the second electrode 32 forms an anode of the diode, and the polarity of the control voltage is to be inverted.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of controlling the breakdown voltage of a diode, the method comprising:

providing a diode which comprises a semiconductor body, a first emitter region of a first conductivity type, a second emitter region of a second conductivity type, a base region arranged between the first and second emitter regions and having a lower doping concentration than the first and second emitter regions, a first emitter electrode electrically coupled to the first emitter region, a second emitter electrode in electrical contact with the second emitter region, a control electrode arrangement comprising a first control electrode section and a first dielectric layer arranged between the first control electrode section and the semiconductor body, and at least one pn junction extending to the first dielectric layer, or arranged distant to the first dielectric layer by less than 250 nm; and adjusting a breakdown voltage of the diode by applying a control potential to the first control electrode section, wherein the base region has a length in a vertical direction of the semiconductor body that is a shortest distance between the first emitter region and the second emitter region, wherein a distance between the first control electrode section and the second emitter region is less than 75% of the length of the base region.

2. The method of claim 1, wherein the first emitter region comprises a contact region having a higher doping concentration than other regions of the emitter region, and the first emitter electrode is electrically connected to the contact region.

3. The method of claim 1, wherein the pn junction is formed between the base region and the first emitter region.

4. The method of claim 1, wherein the diode further comprises a Zener region arranged between the base region and the second emitter region, and wherein a doping type of the Zener region is such that the pn junction is formed between the Zener region and the second emitter region or between the Zener region and the base region.

5. The method of claim 1, wherein the diode further comprises a first control terminal of the first control electrode section.

6. The method of claim 1, wherein the control electrode arrangement further comprises:

a second control electrode section arranged distant to the first control electrode section; and a second dielectric layer arranged between the second control electrode section and the semiconductor body.

7. The method of claim 1, wherein the semiconductor body comprises a first surface, and wherein the diode further comprises first gate electrode sections arranged in trenches extending from the first surface into the semiconductor body.

8. The method of claim 7, wherein the first and second emitter regions are arranged distant from one another in a vertical direction of the semiconductor body.

9. The method of claim 8, wherein the base region has a length in the vertical direction of the semiconductor body, and wherein the first and second control electrode sections extend along more than 25%, more than 50%, more than 75%, or more than 100% of the length of the base region.

10. The method of claim 8, wherein the base region is of the second conductivity type.

11. The method of claim 1, wherein the semiconductor body comprises a first surface, wherein the first and second emitter regions extend from the first surface into the semiconductor body, and wherein the first and second emitter regions are laterally separated from one another in a direction that is parallel to the first surface.

12. The method of claim 6, wherein the first and second control electrode sections in the vertical direction of the semiconductor body extend to the second emitter region.

13. The method of claim 11, wherein the base region is of the first conductivity type.

14. The method of claim 4, wherein the Zener region adjoins the second emitter region in a vertical direction of the semiconductor body.

15. The method of claim 14, wherein at least one of the second emitter region and the Zener region has a lower doping concentration in a region in which the second emitter region and the Zener region adjoin one another.

16. The method of claim 1, wherein the first emitter region and the second emitter region both extend to one surface of the semiconductor body, and wherein the first emitter region further comprises:
 a first emitter section which in a vertical direction of the semiconductor body is arranged distant to the second emitter region; and
 a second emitter section arranged distant to the second emitter in a horizontal direction and in the vertical direction extending from the surface to the first section.

17. The method of claim 1, wherein the base region has a length in the vertical direction of the semiconductor body that is a shortest distance between the first emitter region and the second emitter region, and wherein a distance between the first control electrode section and the second emitter region is less than 75% of the length of the base region.

18. The method of claim 1, wherein the first control electrode section extends along the entire length of the base region.

19. The method of claim 6, wherein the first and second control electrode sections form a single control electrode that forms a closed loop in a direction parallel to a first surface of the semiconductor body.

20. The method of claim 1, wherein the distance between the first control electrode section and the second emitter region is less than 25% of the length of the base region.

* * * * *